(12) United States Patent
Yu

(10) Patent No.: US 6,184,563 B1
(45) Date of Patent: Feb. 6, 2001

(54) DEVICE STRUCTURE FOR PROVIDING IMPROVED SCHOTTKY BARRIER RECTIFIER

(76) Inventor: Ho-Yuan Yu, 19308 Vendura Ct., Saratoga, CA (US) 95070

(*) Notice: Under 35 U.S.C. 154(b), the term of this patent shall be extended for 0 days.

(21) Appl. No.: 09/362,928

(22) Filed: Jul. 27, 1999

Related U.S. Application Data

(60) Provisional application No. 60/094,366, filed on Jul. 27, 1998.

(51) Int. Cl.⁷ .................. H01L 27/095; H01L 29/47; H01L 29/812; H01L 31/07; H01L 31/108
(52) U.S. Cl. .................. 257/471; 257/473; 257/475
(58) Field of Search .................. 257/54, 73, 155, 257/260, 267, 284, 471, 472, 473, 475, 476, FOR 471, FOR 472, FOR 473, FOR 475

(56) References Cited

U.S. PATENT DOCUMENTS 5,101,244 * 3/1992 Mori et al. .................. 257/471
5,612,567 * 3/1997 Baliga .................. 257/475

FOREIGN PATENT DOCUMENTS

404065876 * 3/1992 (JP).

* cited by examiner

Primary Examiner—Olik Chaudhuri
Assistant Examiner—Hoai Pham
(74) Attorney, Agent, or Firm—Bo-In Lin

(57) ABSTRACT

This invention discloses a Schottky barrier rectifier formed in a semiconductor chip of a first conductivity type having a cathode electrode connected thereto near a bottom surface of the semiconductor chip. The Schottky rectifier further includes an epitaxial layer of the first conductivity type of a reduced doping concentration than the semiconductor chip near a top surface of the semiconductor chip. The Schottky rectifier further includes a high resistivity region disposed near peripheral edges of the semiconductor chip containing a reduced dopant concentration than the epitaxial layer. The Schottky rectifier further includes an anode electrode defined by a conductive layer disposed on top over the epitaxial layer wherein the conductive layer having all peripheral edges disposed on top of the high resistivity region. In a preferred embodiment, e.g., the rectifier further includes a barrier height reduction region disposed below the anode electrode disposed at a distance away from the high resistivity region. The barrier height reduction region containing a higher dopant concentration than the epitaxial layer for reducing the barrier height and for reducing a forward resistance of the Schottky rectifier.

5 Claims, 10 Drawing Sheets

DEVICE STRUCTURE FOR PROVIDING IMPROVED SCHOTTKY BARRIER RECTIFIER

This Application claims a Priority Date of Jul. 27, 1998, benefited from a previously filed Provisional Application No. 60/094,366 filed on Jul. 27, 1998 by a same Inventor of this Patent Application.

BACKGROUND OF THE INVENTION

1. Field of the Invention

This invention relates generally to the structure and fabrication process of a Schottky barrier rectifier. More particularly, this invention relates to a novel Schottky device structure and fabrication process where a requirement of p-ring is eliminated and meanwhile the forward current is enhanced and the reverse breakdown voltage is improved.

2. Description of the Prior Art

Conventional rectifier with a Schottky barrier configuration is limited by the technical difficulties of low efficiency, low switching speed, and low reverse breakdown voltage. These difficulties hinders practical applications of the Schottky rectifiers in modern electronic devices when the operational voltage drops from twelve volts to five volts and further down to three volts and lower voltages when the technology moving toward quarter micron feature size and beyond.

FIG. 1 shows a cross sectional view of a conventional Schottky barrier rectifier 10. An N-layer 20 is supported on a N+ substrate 15. In the N-layer 20 a p-ring 25 is formed to eliminate the sharp edge effects between the metal layers 30 and the top surface above the N-layer. The requirement to form the P-ring 25 in the N-layer 20 is to prevent a reverse breakdown due to the sharp edges formed between the metal layer 30 and the top surface of the N-layer 20. However, due to the requirement of providing the p-ring 25, the thickness of the N-layer is limited. The forward voltage $V_f$ and the forward current $I_f$ are limited. Additionally, due to the p-n junction formed between the P-ring 25 and the N-layer 20, the switching speed of the Schottky rectifier is adversely affected.

In U.S. Pat. No. 5,686,753, entitled "Schottky Barrier Diode having a Mesa Structure" Miyata el al. disclose a Schottky barrier diode as that shown in FIG. 2. It includes a compound semiconductor substrate having an N+ layer and an N− layer with the N− layer supported on the N+ layer. The N− layer is configured in a form of a mesa, which has a skirt portion and a slant portion. The diode further includes an insulation layer formed on the skirt portion and the slant portion of the mesa. An anode is formed on the insulation layer and the N− layer. A cathode is formed on the N+ layer. Even with a mesa shape, Miyata's Schottky barrier diode still faced with the problem of sharp edge effect between the anode layer and the N− layer. A reverse breakdown problem would hinder practical application of the device as disclosed in the patent.

Therefore, a need still exits in the art of design and fabrication of the Schottky rectifiers, particularly for low voltage rectifiers, to provide a structure and fabrication process that would resolve these difficulties. More specifically, it is preferably that a Schottky rectifier with a high efficiency can be produced with effective prevention against reverse breakdown without causing a slow down of the switching speed. It is further desirable to employ a simplified manufacture process to reduce the production costs such that a high quality high performance Schottky rectifier can be economically applied.

SUMMARY OF THE PRESENT INVENTION

It is therefore an object of the present invention to provide a new Schottky barrier rectifier with novel structure manufactured by improved fabrication process for eliminating the sharp edge effects between the metal and the top surface of a semiconductor without requiring a P-ring. By placing the edge of the metal layer on top of an insulation layer, the technical difficulty caused by edge effects between the metal semiconductor interface is resolved. The performance characteristics of the Schottky barrier rectifier are improved such that aforementioned limitations and difficulties as encountered in the prior art can be overcome.

Specifically, it is an object of the present invention to provide a new Schottky barrier rectifier with novel structure manufactured by improved fabrication process by placing the edges of a metal anode layer on a trench filled with insulation material. The edge effects are eliminated without requiring the P-rings such that the difficulties arising from the P-ring requirement can be resolved. Schottky rectifiers of higher efficiency can be provided with improved forward current and forward resistance while the premature reverse breakdown is effectively prevented.

Another object of the present invention is to provide a new Schottky barrier rectifier with novel structure manufactured by improved fabrication process by placing the edges of a metal anode layer on a trench filled with insulation material. The edge effects are eliminated without requiring the P-rings such that the difficulties arising from the P-ring requirement can be resolved and the switching speed of the Schottky rectifiers is improved.

Another object of the present invention is to provide a new Schottky barrier rectifier with novel structure manufactured by improved fabrication process by placing the edges of a metal anode layer on a trench filled with insulation material. The edge effects are eliminated without requiring the P-rings because the field build-up at the edges of the metal semiconductor contacts is eliminated. Further improvement is achieved by providing a charge suppression film layer of high resistance formed right on top of the semiconductor such that the reverse breakdown voltage is further improved.

Another object of the present invention is to provide a new Schottky barrier rectifier with novel structure manufactured by improved fabrication process. Specifically, a thin nitride film layer is provided below the metal anode contact layer to improve the reliability by preventing sodium and other contaminants from entering into the rectifier.

Briefly, in a preferred embodiment, the present invention discloses a Schottky barrier rectifier formed in a semiconductor chip of a first conductivity type having a cathode electrode connected thereto near a bottom surface of the semiconductor chip. The Schottky rectifier further includes an epitaxial layer of the first conductivity type of a reduced doping concentration than the semiconductor chip near a top surface of the semiconductor chip. The Schottky rectifier further includes a trench opened from the top surface disposed near peripheral edges of the semiconductor chip filled with an electrical insulation material therein. The Schottky rectifier further includes an anode electrode defined by a conductive layer disposed on top over the epitaxial layer wherein the conductive layer having all peripheral edges disposed on top of the electrical insulation material filling the trench. In a preferred embodiment, the conductive layer having peripheral edges along with inner edges of the trench.

The present invention further discloses a method for fabricating a Schottky rectifier on a semiconductor chip of a first conductivity provided for connecting to a cathode electrode. The method includes the steps of (a) forming an epitaxial layer of a first conductivity type of a reduced doping concentration than the semiconductor chip; (b) applying a trench mask for etching a trench from a top surface of the semiconductor chip near peripheral edges of the semiconductor chip; (c) filling the trench with an electrical insulation material then removing the electrical insulation material from the top surface of the semiconductor chip; and (d) forming a conductive layer over the top surface and patterning the conductive layer into an anode electrode with all edges of the conductive layer disposed on top of the trench filled with the electrical insulation material.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 1:
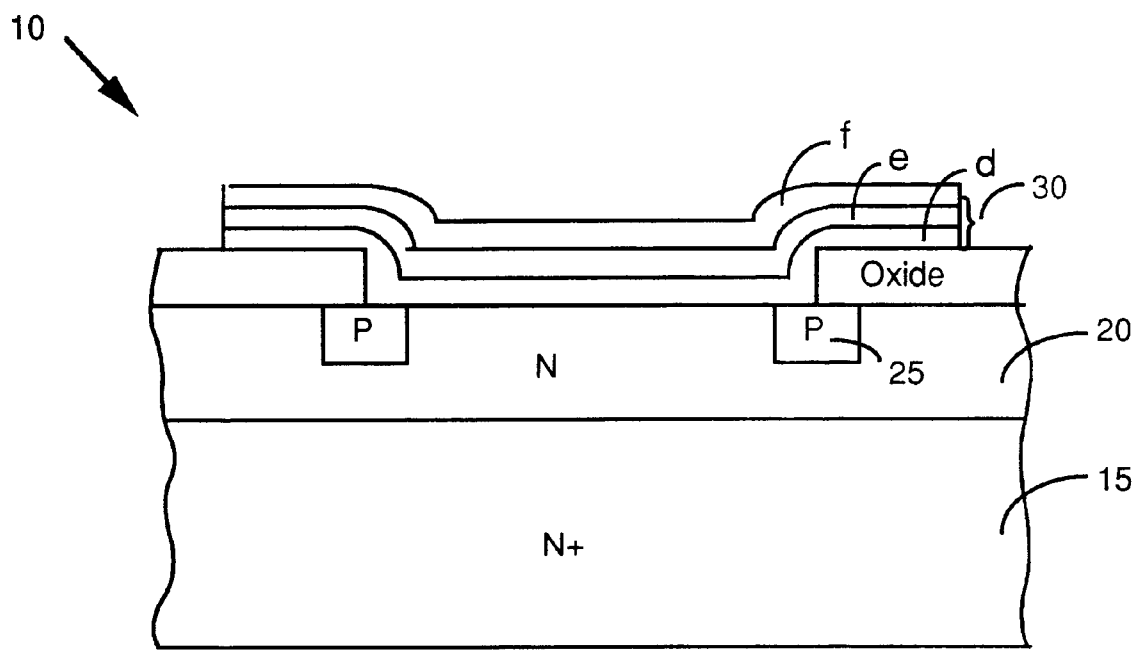
FIG. 1 is a cross-sectional view of a conventional Schottky barrier rectifier where P-rings are employed to reduce the edge effects.
Figure 2:
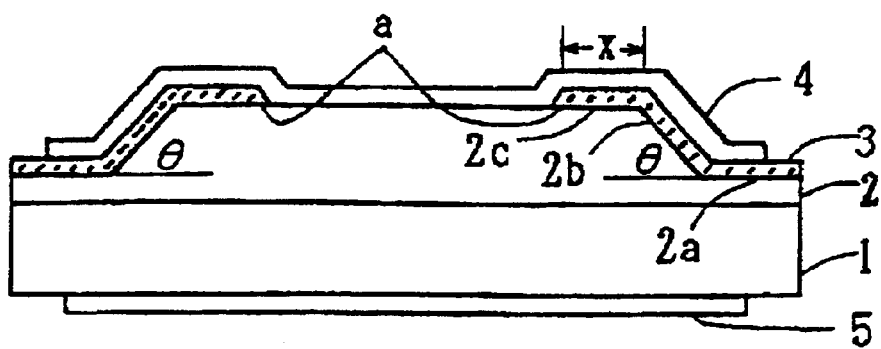
FIG. 2 is a cross sectional view of another prior art Schottky diode with a top layer having a mesa configuration.
Figure 3A:
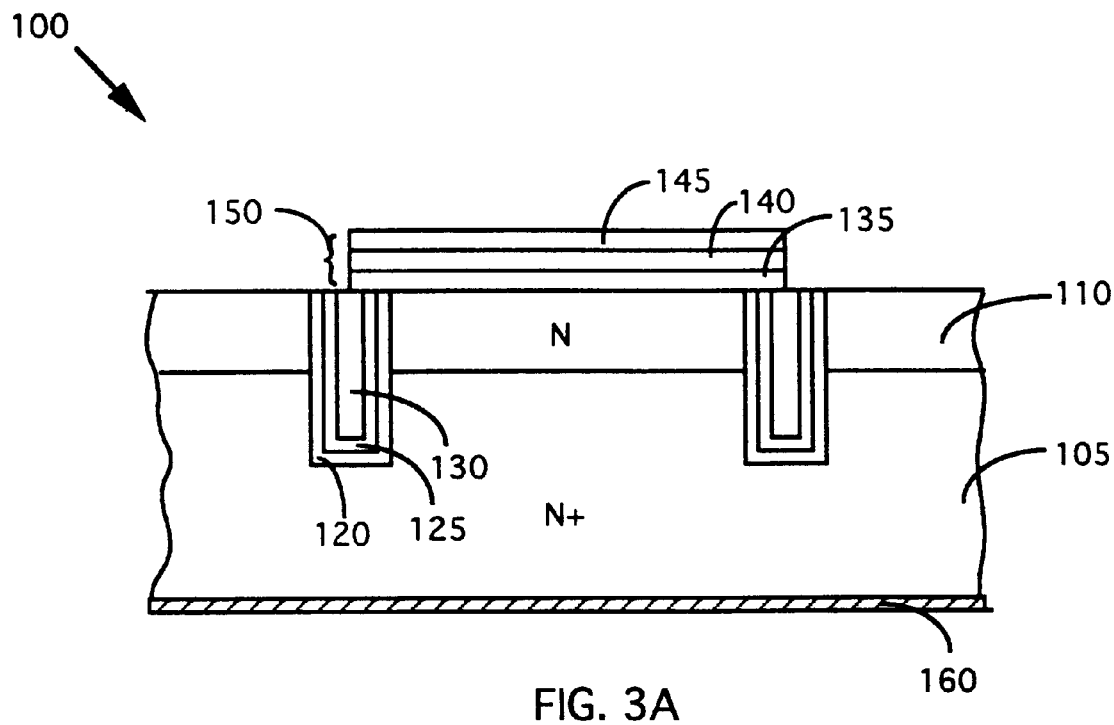
FIGS. 3A to 3D are a cross-sectional views of novel Schottky barrier rectifiers of the present invention.

FIG. 3A is a cross sectional view of a novel Schottky barrier rectifier 100 of the present invention. The rectifier 100 is supported on an N+ substrate 105 with an N− epitaxial layer 110 disposed on top over the N+ substrate 105. The rectifier 100 further includes a trench 115 disposed near the peripheral inside a die separation lines 170 separating the substrate 105, i.e., a semiconductor wafer, into a plurality of dies. The trench is filled with a three-layer filler-structure. The bottom layer is a thin polysilicon layer 120 of high resistance for reducing charge buildup. The middle layer is a nitride layer 125 for increasing the reliability of the device by acting as a barrier layer for preventing sodium or other contaminants to enter into the rectifier. The top layer is an insulation layer 130 such as a silicon dioxide layer filling the trench. After the trench is filled with insulation layer 130, a chemical mechanical polish (CMP) process is employed to polish the wafer.

The Schottky rectifier 100 further includes an anode electrode 150 disposed above and in electrical contact with the N− epitaxial layer 110. The anode electrode 150 in a preferred embodiment is formed with a three-layer structure. The bottom layer 135 is a barrier metal layer for securely attaching to the N− layer 110. The middle layer 140 is a diffusion barrier layer for preventing the contact metal layer 145, i.e., the top layer, to diffuse to the barrier layer 135. The top layer 145 is composed of metals such as silver, nickel, or other metals, which can be employed for die attachment. The anode electrode 150 has the edges disposed above the insulation filling material 130. By providing the trench 115 filling with insulation material 130 near the die separation lines 170 and by disposing the edges of the anode electrode 150 above the insulation material 130 then followed by etching the insulation layer 130 by a photolithography and etch process. Backside ohmic contact 160 is formed by sputtering, chemical evaporation, or plating of a metal layer 160 on the bottom side of the substrate. The undesirable edge effects are eliminated.

Figure 3B:
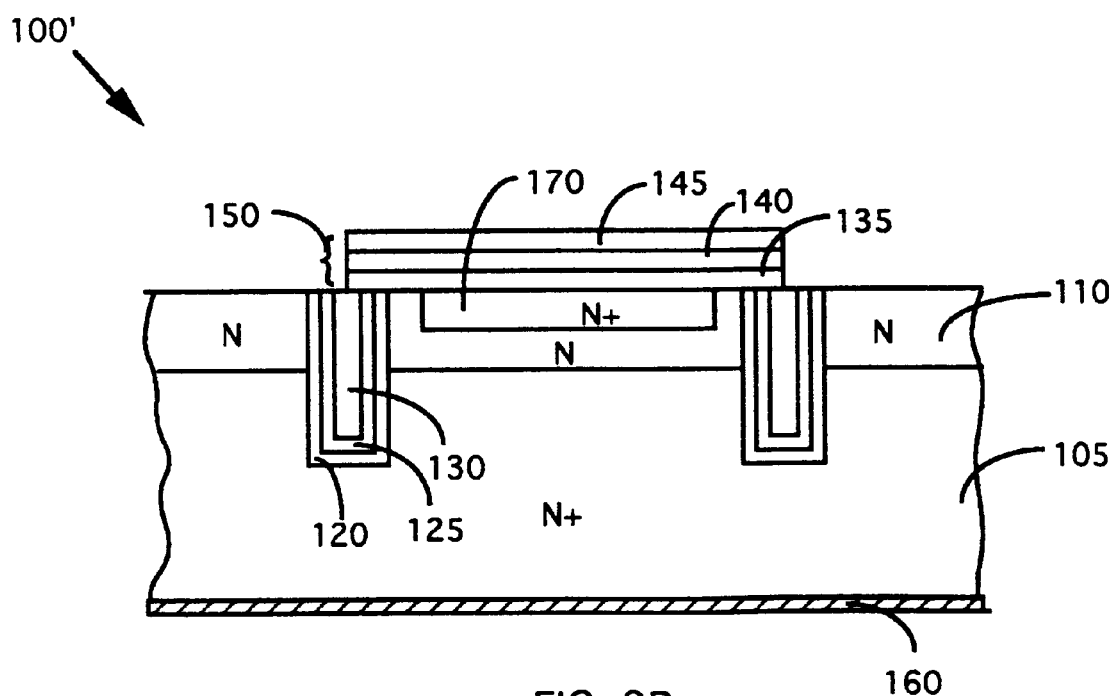

FIG. 3B is a cross sectional view for an alternate preferred embodiment of a Schottky rectifier 100'. The structure of this rectifier 100' is basically the same as the rectifier 100 shown in FIG. 3A. The only difference is that this rectifier 100' has a Schttoky barrier height reduction region 170 formed right below the top surface of the substrate underneath the anode electrode 150. This Schttoky barrier height reduction region 170 has high N-dopant concentration to reduce the Schottky barrier height and can reduce the forward resistance.

Figure 3C:
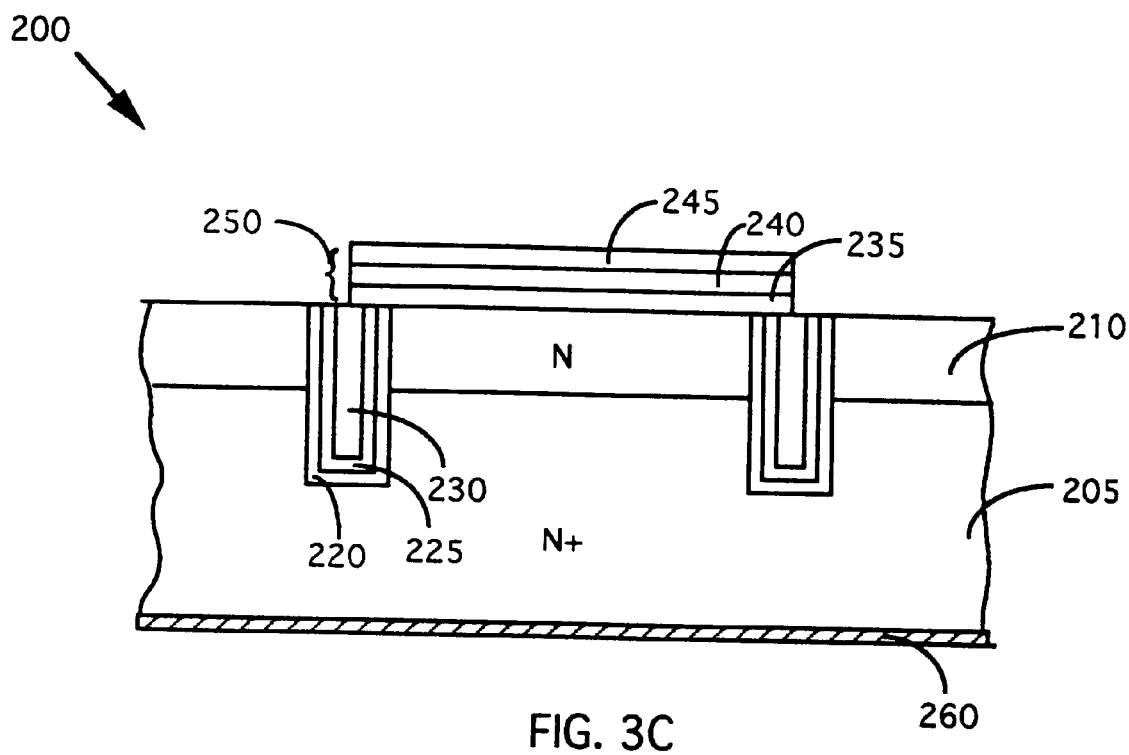
Figure 3D:
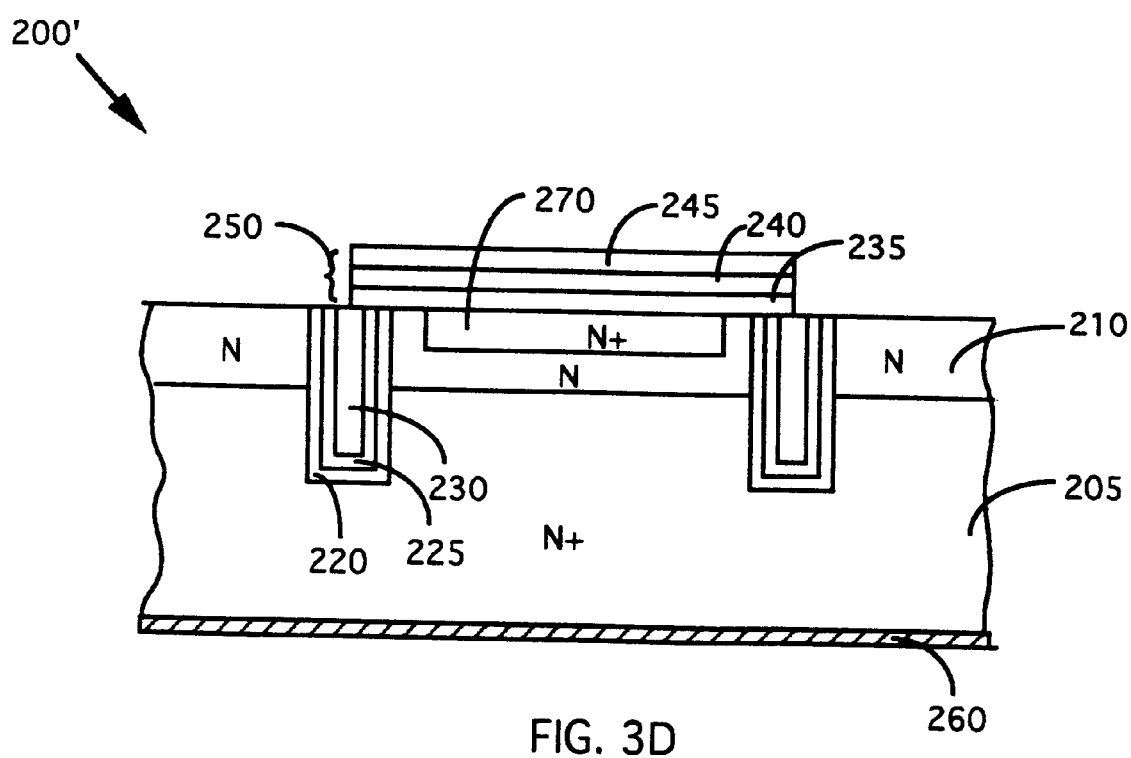

FIG. 3C is a cross sectional view for showing an alternate preferred embodiment of a Schottky rectifier 200. The structure of this rectifier 200 is very similar to the structure of the rectifier 100 as that shown in FIG. 3A. The only difference is that etch of the metal layer overlying the top surface is carried out first to form the anode electrode 250. Then the metal electrode is employed as a mask to etch the trench. The insulation material 230 is then deposited into the trench as trench-filling material. The edges of the electrode disposed on the top surface now having the edges self-aligned with the inner edges of the trench 215. The backside ohmic contact 260 is formed either by sputtering, evaporation, and/or plating of a metal layer on the bottom surface of the substrate. FIG. 3D is an alternate preferred embodiment of a Shottky rectifier 200' has almost identical structure as rectifier 200. The only difference is a Schottky barrier height reduction region 260 formed right under the top surface of the substrate below the anode electrode 250. The barrier height reduction region 260 is formed with higher N-dopant concentration than the epitaxial layer 210 to reduce the barrier height and the forward resistance.

According to FIGS. 3A to 3D and the above descriptions, this invention discloses a Schottky barrier rectifier 100 formed in a semiconductor chip 105 of a first conductivity type having a cathode electrode 160 connected thereto near a bottom surface of the semiconductor chip 105. The Schottky rectifier 100 further includes an epitaxial layer 110 of the first conductivity type of a reduced doping concentration than the semiconductor chip 105 near a top surface of the semiconductor chip. The Schottky rectifier 100 further includes a trench 115 opened from the top surface disposed near peripheral edges of the semiconductor chip filled with an electrical insulation material 130 therein. The Schottky rectifier 100 further includes an anode electrode 150 defined by a conductive layer 145 disposed on top over the epitaxial layer wherein the conductive layer 145 having all peripheral edges disposed on top of the electrical insulation material 130 filling the trench 115. In a preferred embodiment, e.g., the rectifier 200, the conductive layer 245 having peripheral edges along with inner edges of the trench 215. In a preferred embodiment, the rectifier further includes a Schottky barrier reduction region disposed immediately beneath the anode electrode. The Schottky barrier reduction region is encompassed in the epitaxial layer and having a doping concentration of the first conductivity type higher than the epitaxial layer. In a preferred embodiment, the trench filled with an insulation material comprising a high resistivity polysilicon layer covering the trench, a barrier nitride layer covering the high resistivity polysilicon layer and a silicon oxide layer filling the trench. In a preferred embodiment, the anode electrode further comprising a barrier metal layer covering and attached to a top surface of the substrate, a diffusion barrier metal layer overlying the barrier metal layer and a top metal layer disposed on top the diffusion barrier layer.

Figure 4A:
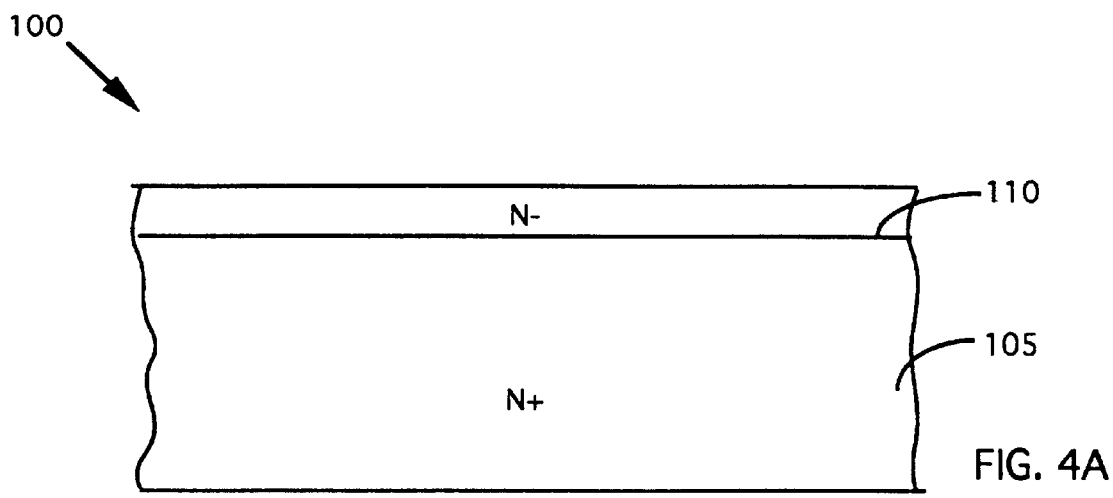
FIGS. 4A to 4G are a series of cross-sectional views for illustrating the fabrication processes for an improved Schottky barrier rectifier of the present invention.

Please refer to FIGS. 4A to 4G for the processing steps carried out to manufacture a Schottky rectifier 100 of this invention. As shown in FIG. 4A, the processing steps begins by first growing a N− epitaxial layer 110 with a resistivity ranging from 0.1 to 10.0 ohm-cm on top of a N+ substrate 105. The substrate has a resistivity of 0.001 to 0.05 ohm-cm. The resistivity of the epitaxial layer 110 depends on the device requirements for the on-resistance and breakdown voltage. In a preferred embodiment, the thickness of the epi-layer 110 is about one to ten microns (1–10 $\mu$m).

Figure 4B:
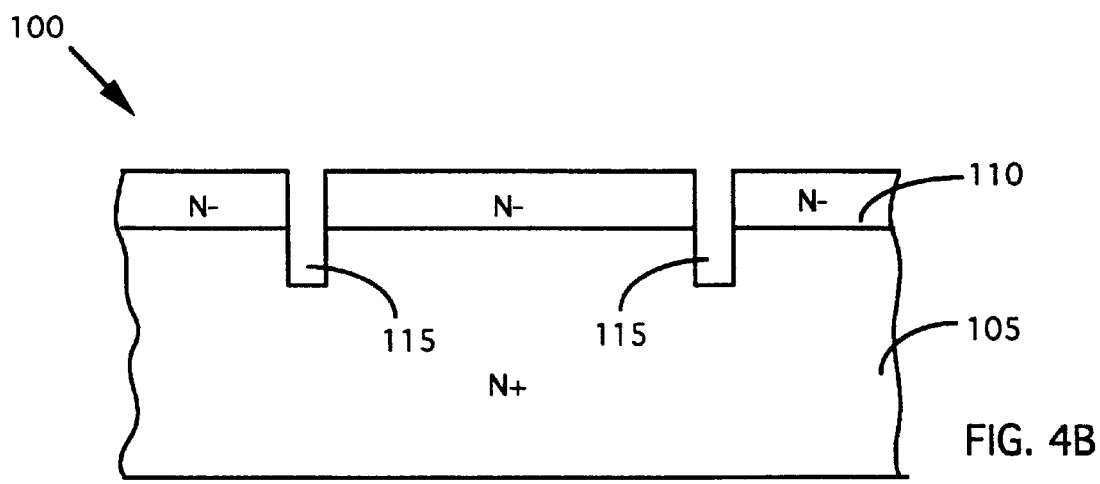

Referring to FIG. 4B, a photoresist (not shown) is employed as a trench mask to perform a trench etch process, which is a dry anisotropic etch process, to form trenches 115 of 2 to 20 micrometers in width and 2 to 15 micrometers in depth. The photoresist is then removed.

Figure 4C:
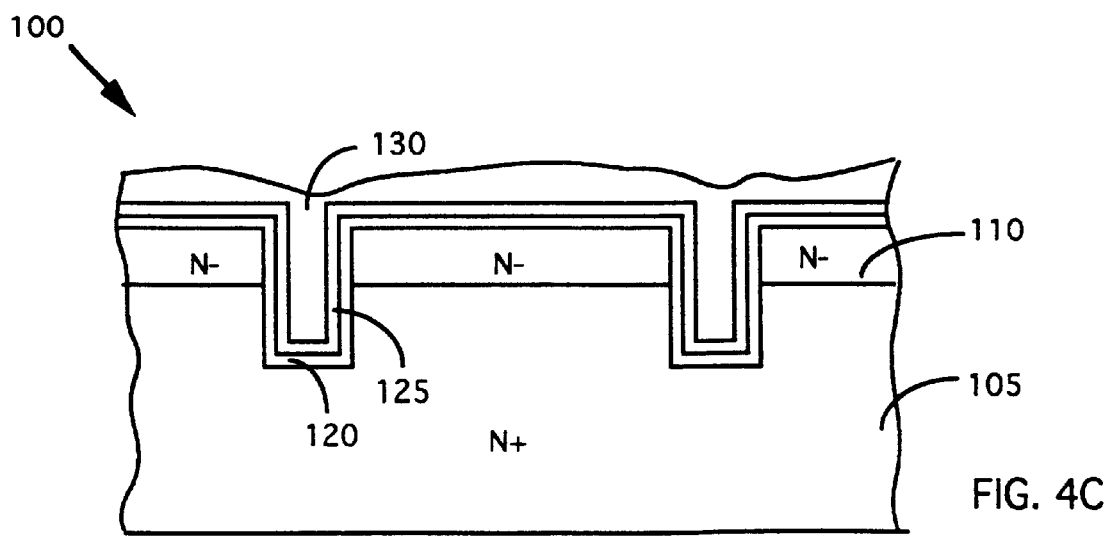
Figure 4D:
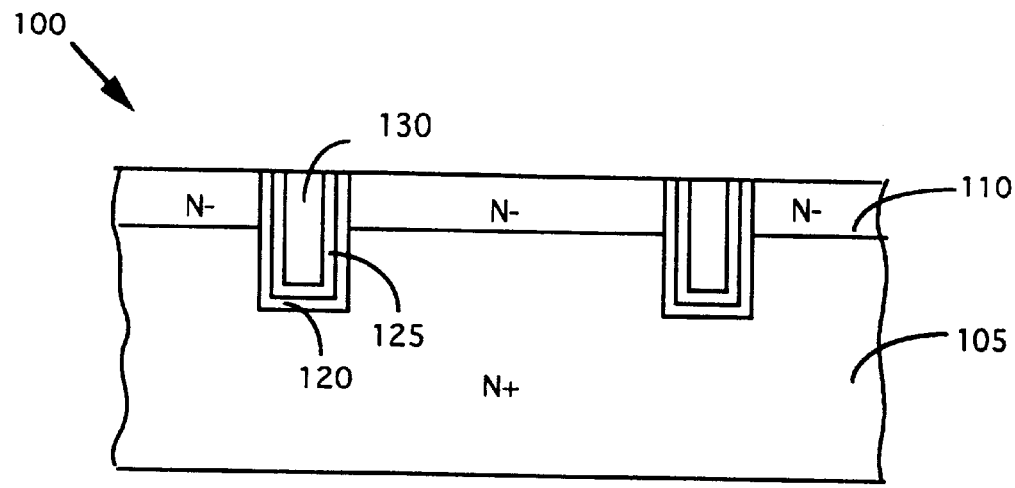

In FIG. 4C, a thin polysilicon or amorphous silicon film 120 of high resistivity over $10^6$ ohm-cm with a thickness ranging from 50 to 1000 Angstroms is formed by a chemical vaporization deposition (CVD) process. The purpose of this high-resistive polysilicon layer 120 is to reduce the charge build-up, which will be further explained below. A barrier layer 125, e.g., a thin nitride layer ranging from 50 to 500 Angstroms, is then deposited on top of the polysilicon layer. The trenches are then filled with an insulation layer 130, which can be an oxide layer or combination of oxide and spin-on-glass (SOG) to fill the trench. This oxide layer may be formed y a plasma oxide deposition process. In FIG. 4D, a chemical-mechanical polishing (CMP) process is carried out to polish and planarize the top surface.

Figure 4E:
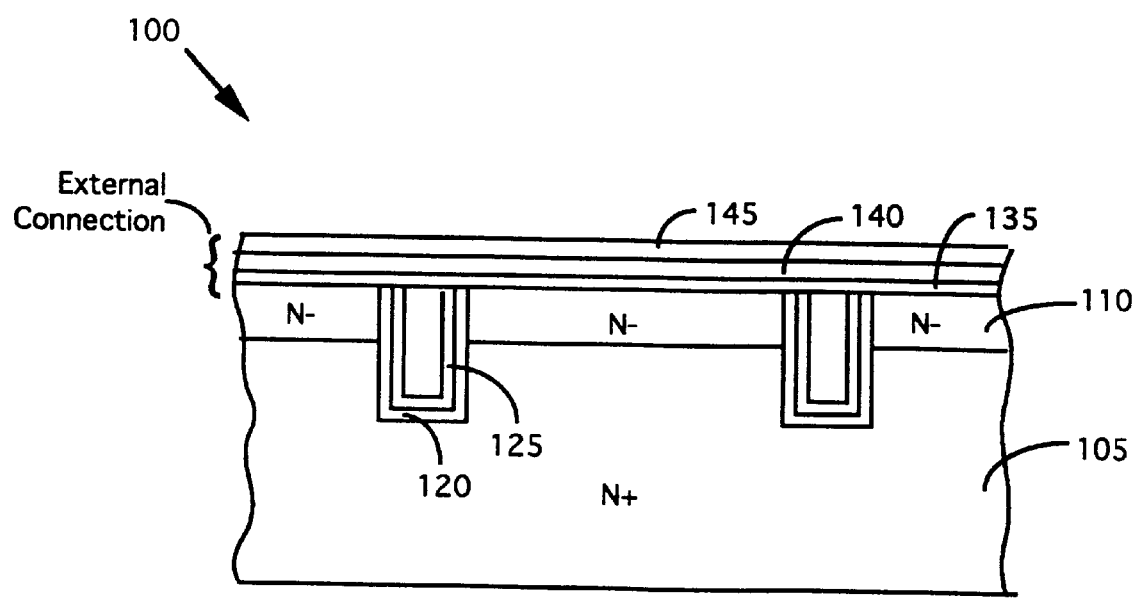

In FIG. 4E, a barrier metal layer 135, e.g., a metal layer of molybdenum (Mo), nickel (Ni), chromium (Cr), etc., with a thickness of approximately 0.1 to 0.5 micrometers is first formed overlying the top surface. An intermediate metal layer 140 such as a layer of titanium (Ti), titanium-tungsten (TiW), etc. is then formed covering the barrier metal layer 135. Then a contact metal layer 145 that may be a layer of silver, gold, nickel or other conductive metal layer, is then deposited on the top. A backside metalization process, such as nickel or gold plating or other type of metallic plating process, is performed to form the cathode contact 160 at the bottom surface of the Schottky rectifier.

Figure 4F:
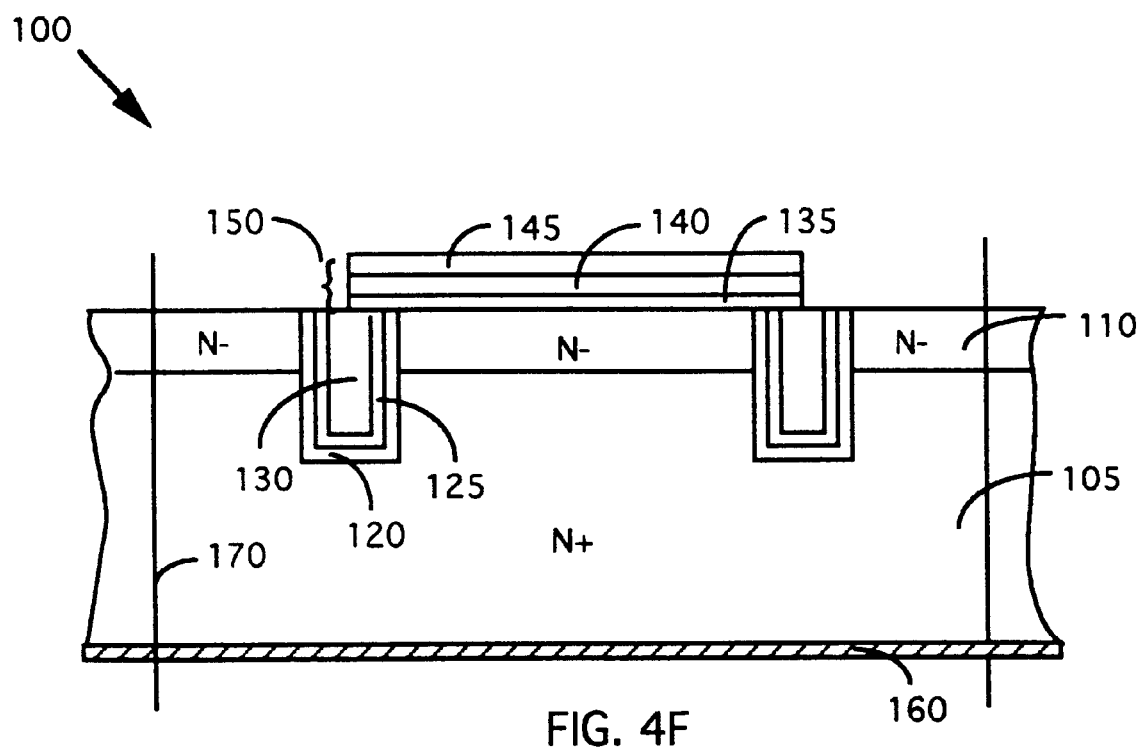
Figure 4G:
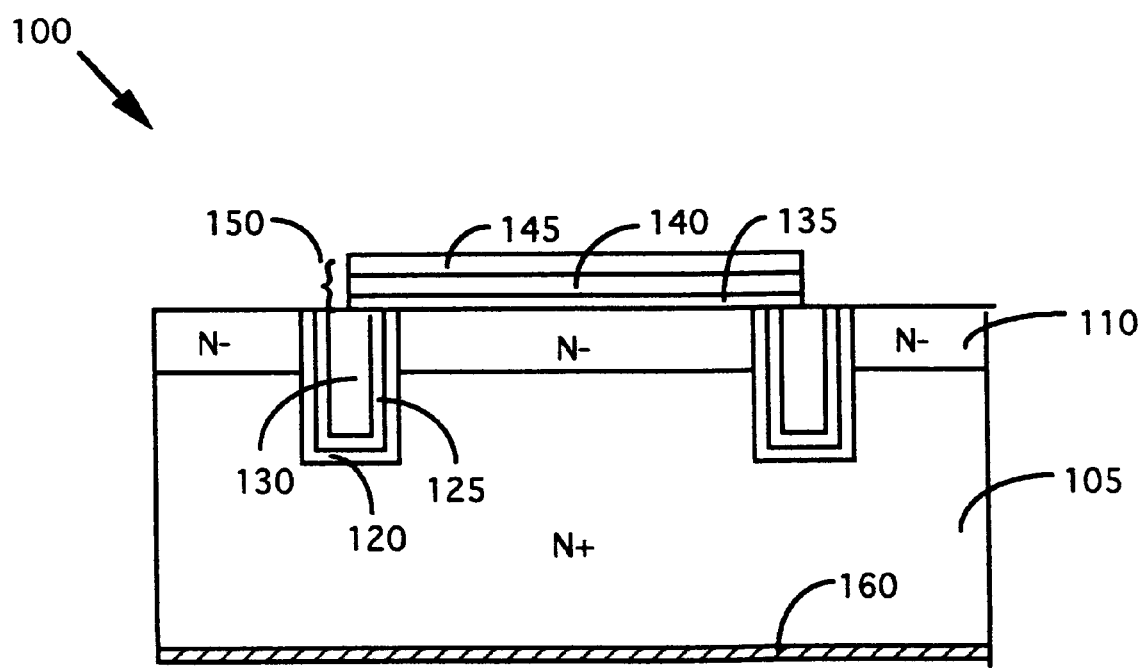

In FIG. 4F, a mask is applied to perform an etching process to remove the peripheral portion of top metal layers 135, 140 and 145. The peripheral portion that is removed from the top metal layers is a portion from the middle point of the trench 115 to edges 170 of the die. After patterning of the top metal layers, an anode electrode 150 is formed on the top surface comprising three metal layers 135, 140 and 145. The anode electrode 150 is formed above and in electrical contact with the N− layer 110. The anode electrode is formed with the edges disposed above the insulation trench filling material 130. The problems of vulnerable reverse breakdown near the metal-semiconductor sharp edge interfaces are therefore resolved by placing the edges of the anode electrode on top of a trench filled with insulation material. In FIG. 4G, a die separation operation is performed to divide the wafer along the edges 170 into a plurality of dies with each die provided with an improved Schottky barrier rectifier 100.

According to FIGS. 4A to 4G, and above description, this invention discloses a method for fabricating a Schottky rectifier 100 on a semiconductor chip 105 of a first conductivity provided for connecting to a cathode electrode 160. The method includes the steps of (a) forming an epitaxial layer 110 of a first conductivity type of a reduced doping concentration than the semiconductor chip; (b) applying a trench mask for etching a trench 115 from a top surface of the semiconductor chip near peripheral edges of the semiconductor chip; (c) filling the trench with an electrical insulation material 130 then removing the electrical insulation material from the top surface of the semiconductor chip; and (d) forming a conductive layer 145 over the top surface and patterning the conductive layer into an anode electrode 150 with all edges of the conductive layer 145 disposed on top of the conductive material 130 filling the trench 115.

Figure 5A:
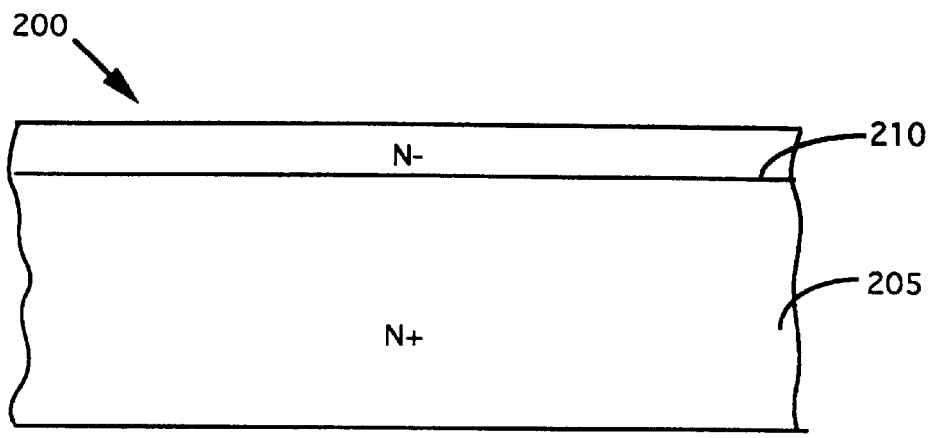
FIGS. 5A to 5F are a series of cross-sectional views for illustrating the fabrication processes for an alternate improved Schottky barrier rectifier of the present invention.

FIGS. 5A to 5F are a series of cross sectional views for showing an alternate processing steps carried out to manufacture a Schottky rectifier 200 of this invention. As shown in FIG. 5A, the processing steps begins by first growing a N− epitaxial layer 210 on top of a N+ substrate 205. In a preferred embodiment, the thickness of the epi-layer 210 is about one to ten micrometers (1–10 $\mu$m).

Figure 5B:
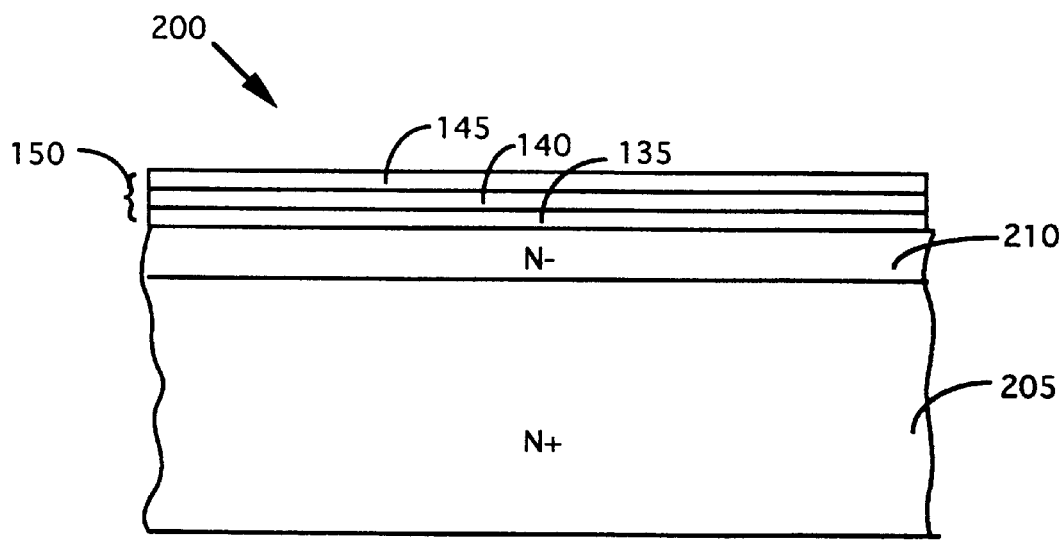

Referring to FIG. 5B, a barrier metal layer 235, e.g., a metal layer of molybdenum (Mo), nickel (Ni), chromium (Cr), etc., with a thickness of approximately 0.01 to 0.05 micrometers is first formed overlying the top surface. An intermediate metal layer 240 such as a layer of titanium (Ti), titanium-tungsten (TiW), etc. is then formed covering the barrier metal layer 235. Then a contact metal layer 245 that may be a layer of silver, gold, nickel or other conductive metal layer, is then deposited on the top. A backside metalization process, such as nickel or gold plating or other type of metallic plating process, is performed to form the cathode contact 160 at the bottom surface of the Schottky rectifier.

Figure 5C:
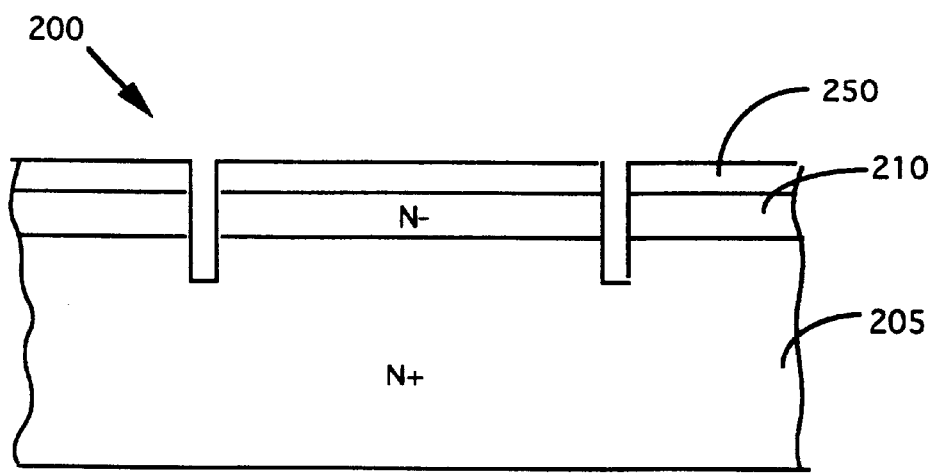

In FIG. 5C, a photoresist (not shown) is employed as a metal mask to perform a metal-etch process. After the metal etch is completed for defining the electrode, the etched metal is used as mask to etch the trenches to form trenches 215 near the edge die-separation lines 270 through the metal layers 235, 240 and 245 and the epitaxial layer 210. The etch process is a dry anisotropic etch process to form trenches 215 of two to twenty microns in width and one to fifteen microns in depth. The photoresist can be removed either before the trench etch or after the trench etch.

Figure 5D:
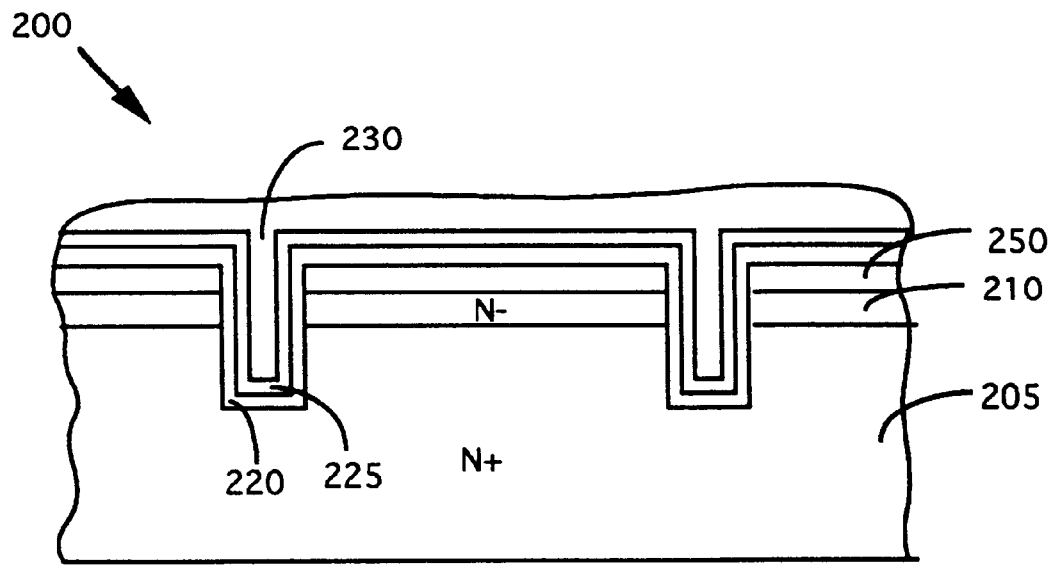
Figure 5E:
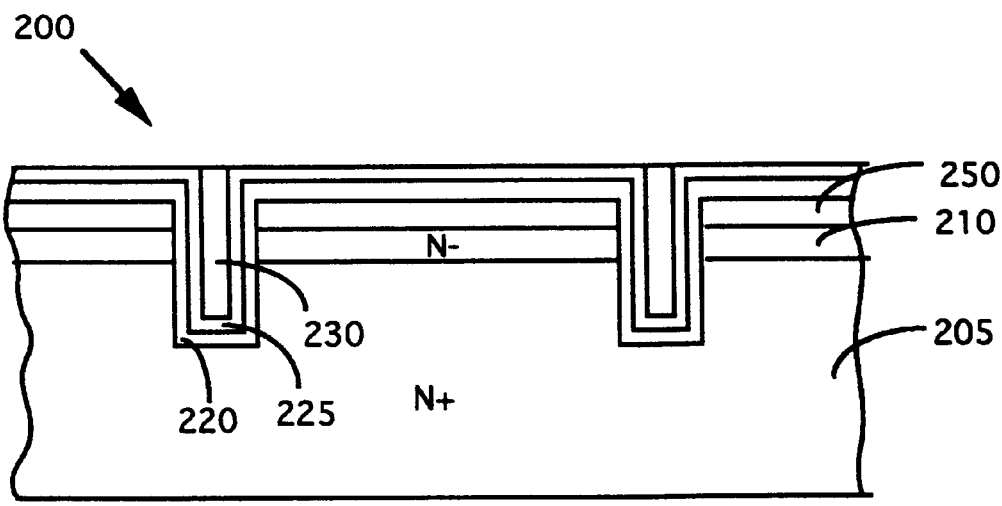

In FIG. 5D, a thin polysilicon or an amorphous silicon film 220 of high resistivity over $10^6$ ohm-cm with a thickness ranging from 50 to 1000 Angstroms is formed by an plasma enhanced chemical vapor deposition (CVD) process. The purpose of this high-resistive polysilicon layer 220 is to reduce the charge build-up. A barrier layer 225, e.g., a thin nitride layer ranging from 50 to 500 Angstroms, is then deposited on top of the polysilicon layer. The trenches are then filled with an insulation layer 230, which can be an oxide layer, which can be formed by a spin-on-glass (SOG) process depending on the width and depth of the trench. A low-temperature plasma oxide-deposition process may be used to form this oxide layer. In FIG. 5E, an etch process is performed to remove the polysilicon layer 220, the barrier layer 225, and the insulation layer 230 above the top surface of the metal contact layer 245. A chemical-mechanical polishing (CMP) process may be used to polish and planarize the top surface.

Figure 5F:
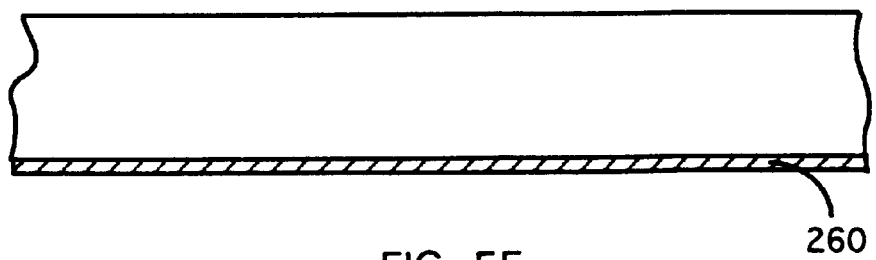
Figure 5G:
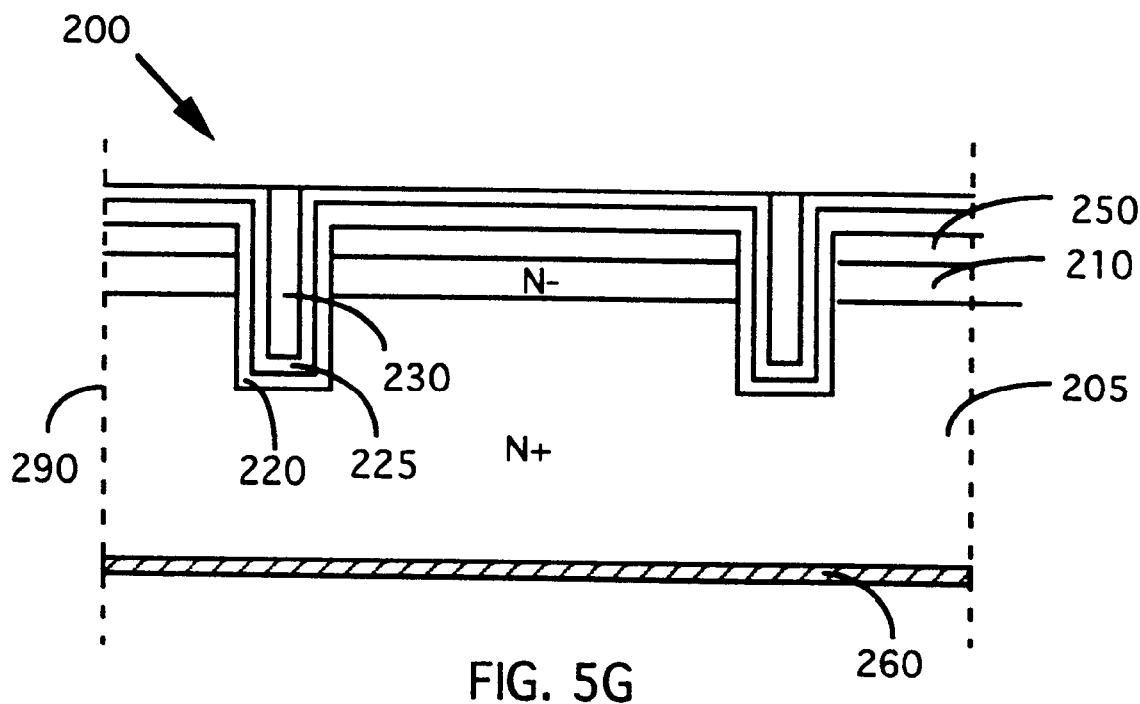

After the CMP process for polishing and removing layers 220, 225 and 230, the top metal layers 245 are exposed to define an anode electrode on the top surface comprising three metal layers 235, 240 and 245. The anode electrode 250 is formed above and in electrical contact with the N− layer 210. The anode electrode 250 is formed with the edges disposed along the edge of the insulation trench filling material 230. The problems of vulnerable reverse breakdown near the metal-semiconductor sharp edge interfaces are therefore resolved by placing the edges of the anode electrode on top of a trench filled with insulation material. In FIG. 5F, a die separation operation is performed to divide the wafer along the edges 270 into a plurality of dies with each die provided with an improved Schottky barrier rectifier 200.

According to FIGS. 5A to 5F, the present invention further discloses a method for fabricating a Schottky barrier rectifier on a semiconductor chip 205 of a first conductivity provided for connecting to a cathode electrode 260. The method includes the steps of (a) forming an epitaxial layer 210 of a first conductivity type of a reduced doping concentration than the semiconductor chip; (b) forming a conductive layer 245 over the top surface; (c) applying a trench mask for etching a trench 215 through the conductive layer and semiconductor chip near peripheral edges of the semiconductor chip; (d) filling the trench with an electrical insulation material 230 then removing the electrical insulation material from the top surface of the semiconductor chip thus patterning the conductive layer into an anode electrode 250 with all edges of the conductive layer 245 aligned with inner edges of the trench 115 filled with conductive material 230.

Figure 6A:
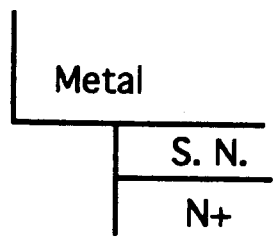
FIGS. 6A and 6B illustrate the interface configurations between the edges of the conductive layer employed as an anode electrode and the trench, both for eliminating the edge effects.
Figure 6B:
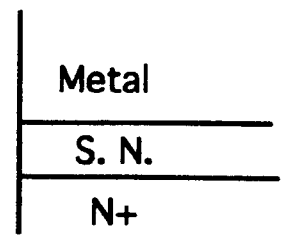

According to the above description, this invention discloses a Schottky rectifier supported on a semiconductor substrate. The substrate includes an anode electrode defined by a conductive layer disposed on top over the substrate wherein the conductive layer having bottom edge-corners disposed over a top surface of the substrate and in direct contact with an insulation layer. As shown in FIG. 6A, the conductive layer has the bottom edge-corners disposed over an insulation layer. As shown in FIG. 6B, the conductive layer having the bottom edge-corners defined by a side anode edge align with a substrate trench edge where the anode edge and the substrate trench edge disposed next to an insulation layer.

Figure 7A:
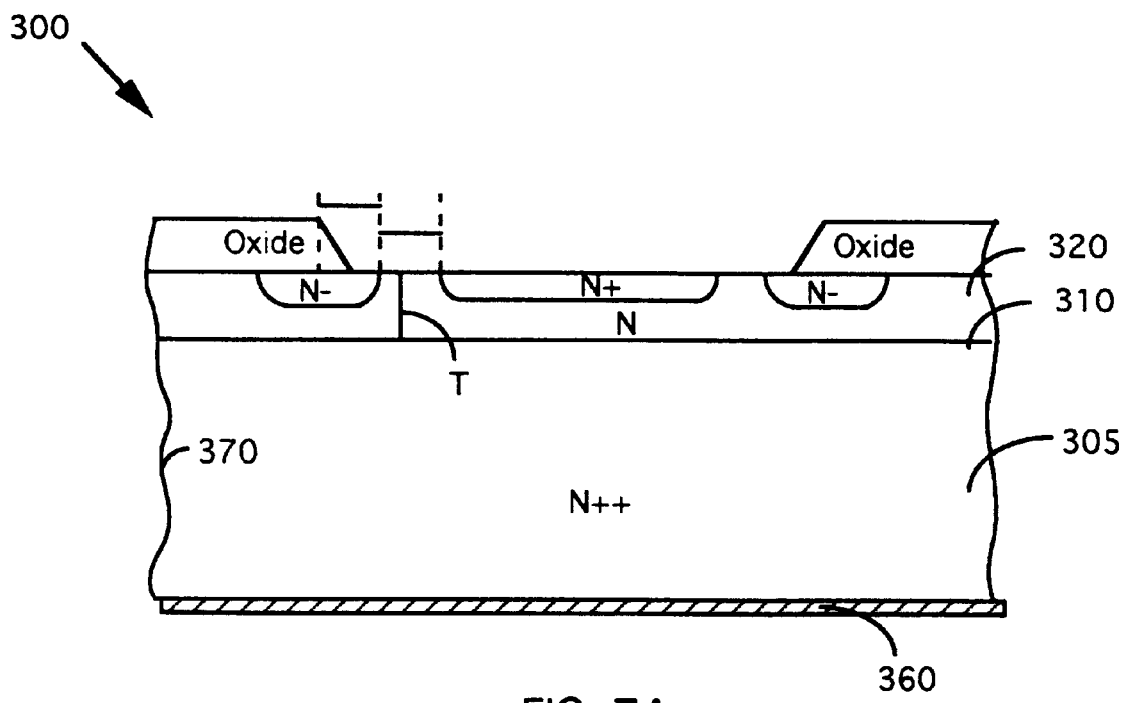
FIG. 7 shows a cross sectional view of an alternate preferred embodiment of the present invention to improve the reverse breakdown voltage and the barrier height of a Schottky rectifier.

FIG. 7A shows another preferred embodiment of a Schottky barrier rectifier 300 of the present invention. The rectifier 300 is supported on an $N^{++}$ substrate 305 with an N epitaxial layer 310 with a thickness ranging between half micrometer to ten micrometers. The epitaxial layer 310 is disposed on top over the $N^{++}$ substrate 305. The $N^{++}$ substrate region 305 has a resistivity about 0.05 ohm-cm and the epitaxial layer 310 has a resistivity ranging from 0.1 to 10 ohm-cm. The rectifier 300 further includes a shallow N+ region, i.e., a barrier-height reduction region 315, right under the top surface of the N-epitaxial layer 310 to reduce the barrier height of the Schottky rectifier 300. In a preferred embodiment, the shallow N+ dopant region has a dopant concentration ranging from $10^{15}$ to $10^{17}/cm^3$ of phosphorous ions. The rectifier 300 further includes an N− region, which is a high resistivity region 320, disposed near the peripheral, inside die separation lines 370 separating the substrate 305, i.e., a semiconductor wafer, into a plurality of dies. The N− high resistivity region 320, with a lower N-type dopant concentration than the epitaxial layer 310, is formed right below the interface edges 333 of a three-layer anode electrode-structure 340. The N− high resistivity region 320, with a lower N-type dopant concentration is formed in the substrate extend beyond the sharp interface edge 333 by a distance represented by A. The distance A has a range between half micrometer to fifty micrometers. The N− high resistivity region 320 is also formed to have distance B away from the barrier-height reduction region 315 where B can have a range between half micrometer to fifty micrometers.

Figure 7B:
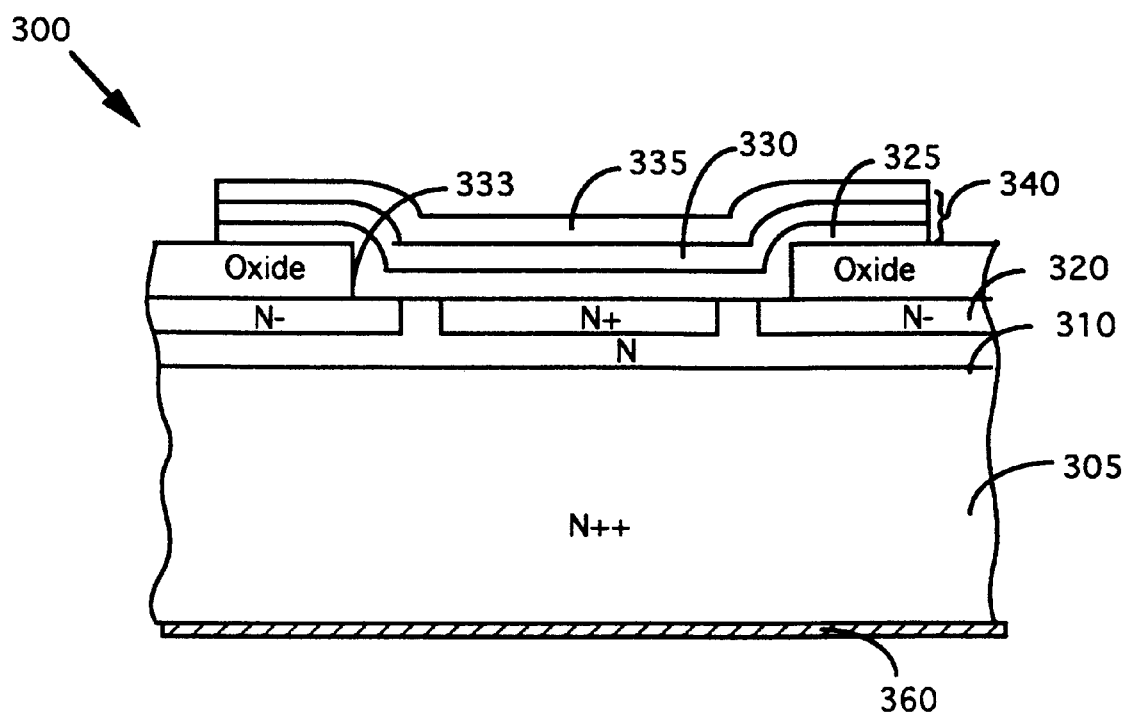

Referring to FIG. 7B, for details of layer structure of the three-layer anode electrode 340. A bottom layer of the three-layer anode electrode is barrier metal layer 325 for securely attaching to the top surface of the N+ layer 315. The middle layer 330 is a diffusion barrier layer for preventing the contact metal layer 335, i.e., the top layer, to diffuse to the barrier layer 325. The top layer 335 is composed of metals such as silver, nickel, or other metals, which can be employed for die attachment. The anode electrode 340 has edges 333 disposed above the high resistivity region 320 with peripheral areas above the top surface of the substrate insulated by a silicon oxide layer 345. By providing a high resistivity region 320 right below the interface edges 333, the reverse breakdown voltage is increased. The undesirable edge effects are reduced.

According to FIG. 7 and the above descriptions, this invention discloses a Schottky barrier rectifier 300 formed in a semiconductor chip 305 of a first conductivity type having a cathode electrode 360 connected thereto near a bottom surface of the semiconductor chip 305. The Schottky rectifier 300 further includes an epitaxial layer 310 of the first conductivity type of a reduced doping concentration than the semiconductor chip 305 near a top surface of the semiconductor chip. The Schottky rectifier 300 further includes a high resistivity region 325 disposed near peripheral edges of the semiconductor chip containing a reduced dopant concentration than the epitaxial layer 310. The Schottky rectifier 300 further includes an anode electrode 350 defined by a conductive layer 350 disposed on top over the epitaxial layer wherein the conductive layer 350 having all peripheral edges disposed on top of the high resistivity region 325. In a preferred embodiment, e.g., the rectifier 300 further includes a barrier height reduction region 315 disposed below the anode electrode 350 disposed at a distance away from the high resistivity region 325. The barrier height reduction region 315 containing a higher dopant concentration than the epitaxial layer for reducing the barrier height and for reducing a forward resistance of the Schottky rectifier 300.

Therefore, the present invention provides a new Schottky barrier rectifier with novel structure manufactured by improved fabrication process for eliminating the sharp edge effects between the metal and the top surface of a semiconductor without requiring a P-ring. By placing the edge of the metal layer on top of an insulation layer, the technical difficulty caused by edge effects between the metal-semiconductor interface is resolved. The performance characteristics of the Schottky barrier rectifier are improved such that aforementioned limitations and difficulties as encountered in the prior art are overcome. Specifically, a new Schottky barrier rectifier with novel structure is manufactured by an improved fabrication process by placing the edges of a metal anode layer on a trench filled with insulation material. The edge effects are eliminated without requiring the P-rings such that the difficulties arising from the P-ring requirement can be resolved. Schottky rectifiers of higher efficiency are provided with improved forward current and forward resistance while the reverse breakdown is effectively prevented. By eliminating the P-ring, the switching speed of the Schottky rectifiers is also improved. Further improvement is achieved by providing a charge suppression film layer of high resistance formed right on top of the semiconductor such that the reverse breakdown voltage is further improved. Also, a thin nitride film layer is provided below the metal anode contact layer to improve the reliability by preventing sodium and other contaminants from entering into the rectifier.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

We claim:

1. A Schottky rectifier supported on a semiconductor substrate of a first conductivity type having a cathode electrode connected thereto near a bottom surface of said semiconductor substrate, said Schottky rectifier further comprising:

an epitaxial layer of said first conductivity type of a reduced doping concentration than said semiconductor substrate near a top surface of said semiconductor substrate;

a trench opened from said top surface disposed near edges of said semiconductor substrate filled with an electrical insulation material therein; and an anode electrode defined by a conductive layer disposed on top over said epitaxial layer wherein said conductive layer having edges disposed on top of said electrical insulation material filling said trench.

2. The Schottky rectifier of claim 1 further comprising:

a Schottky barrier reduction region disposed immediately beneath said anode electrode, said Schottky barrier reduction region encompassed in said epitaxial layer and having a doping concentration of said first conductivity type higher than said epitaxial layer.

3. The Schottky rectifier of claim 1 wherein:

said trench filled with an insulation material comprising a high resistivity polysilicon layer covering said trench, a barrier nitride layer covering said high resistivity polysilicon layer and a silicon oxide layer filling said trench.

4. The Schottky rectifier of claim 1 wherein:

said anode electrode further comprising a barrier metal layer covering and attached to a top surface of said substrate, a diffusion barrier metal layer overlying said barrier metal layer and a top metal layer disposed on top said diffusion barrier layer.

5. A Schottky rectifier supported on a semiconductor substrate of a first conductivity type having a cathode electrode connected thereto near a bottom surface of said semiconductor substrate, said Schottky rectifier further comprising:

an epitaxial layer of said first conductivity type of a reduced doping concentration than said semiconductor substrate near a top surface of said semiconductor substrate;

a trench opened from said top surface disposed near edges of said semiconductor substrate filled with an electrical insulation material therein and said insulation material comprising a high resistivity polysilicon layer covering said trench, a barrier nitride layer covering said high resistivity polysilicon layer and a silicon oxide layer filling said trench;

an anode electrode defined by a conductive layer disposed on top over said epitaxial layer wherein said conductive layer further comprising a barrier metal layer covering and attached to a top surface of said substrate, a diffusion barrier metal layer overlying said barrier metal layer and a top metal layer disposed on top said diffusion barrier layer; and said conductive layer having edges disposed on top of said electrical insulation material filling said trench.

* * * * *